United States Patent
Zhai

(10) Patent No.: US 10,249,691 B2
(45) Date of Patent: Apr. 2, 2019

(54) FLEXIBLE ORGANIC LIGHT-EMITTING DISPLAY PANEL AND ELECTRONIC DEVICE

(71) Applicant: Wuhan Tianma Micro-Electronics Co., Ltd., Wuhan (CN)

(72) Inventor: Yingteng Zhai, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/788,527

(22) Filed: Oct. 19, 2017

(65) Prior Publication Data

US 2018/0040678 A1    Feb. 8, 2018

(30) Foreign Application Priority Data

Jun. 30, 2017    (CN) .......................... 2017 1 0523163

(51) Int. Cl.
| | |
|---|---|
| H01L 29/08 | (2006.01) |
| H01L 27/32 | (2006.01) |
| G06F 3/045 | (2006.01) |
| H01L 51/00 | (2006.01) |
| G01L 1/22 | (2006.01) |
| G06F 3/041 | (2006.01) |
| G01L 1/20 | (2006.01) |

(52) U.S. Cl.
CPC .......... *H01L 27/3225* (2013.01); *G01L 1/205* (2013.01); *G01L 1/2281* (2013.01); *G06F 3/045* (2013.01); *G06F 3/0412* (2013.01); *G06F 3/0414* (2013.01); *H01L 27/3276* (2013.01); *H01L 51/0097* (2013.01); *G01L 1/2262* (2013.01); *G06F 2203/04102* (2013.01); *H01L 2251/5338* (2013.01)

(58) Field of Classification Search
CPC ............. H01L 27/3225; H01L 51/0097; H01L 27/3276; H01L 2251/5338; G01L 1/2281; G01L 1/2206; G01L 1/18; G01L 1/2262; G06F 3/045; G06F 3/0412; G06F 3/0414; G06F 2203/04102
See application file for complete search history.

(56) References Cited

U.S. PATENT DOCUMENTS

| | | | | |
|---|---|---|---|---|
| 2008/0011095 A1* | 1/2008 | Bloom | ...................... | G01L 1/20 73/819 |
| 2013/0169589 A1* | 7/2013 | Suzuki | ................... | G06F 3/041 345/174 |
| 2014/0098028 A1* | 4/2014 | Kwak | ....................... | G09G 5/00 345/173 |

(Continued)

*Primary Examiner* — Anthony Ho
*Assistant Examiner* — Mohammad M Hoque
(74) *Attorney, Agent, or Firm* — Alston & Bird LLP

(57) ABSTRACT

Disclosed are a flexible organic light-emitting display panel and an electronic device. The flexible organic light-emitting display panel comprises: a display region and a non-display region surrounding the display region, wherein the non-display region comprises a bendable region and a non-bendable region; at least one metal bridge pressure-sensitive detection unit, which is at least partially provided in the bendable region and extends along a bending direction of the flexible organic light-emitting display panel; a plurality of semiconductor pressure-sensitive detection units, which are at least provided in the non-bendable region.

19 Claims, 18 Drawing Sheets

(56) References Cited

U.S. PATENT DOCUMENTS

| | | | |
|---|---|---|---|
| 2015/0185944 A1* | 7/2015 | Magi | G06F 1/1652 |
| | | | 345/174 |
| 2016/0103545 A1* | 4/2016 | Filiz | G01L 1/18 |
| | | | 345/174 |
| 2016/0162093 A1* | 6/2016 | Kim | G06F 3/0412 |
| | | | 345/174 |
| 2016/0190216 A1* | 6/2016 | Yang | G01B 7/18 |
| | | | 257/91 |
| 2016/0283014 A1* | 9/2016 | Rider | G06F 1/1652 |
| 2016/0320899 A1* | 11/2016 | Watazu | G06F 3/047 |
| 2017/0010704 A1* | 1/2017 | Chen | G06F 3/0412 |
| 2017/0024049 A1* | 1/2017 | Tachikawa | G06F 3/044 |
| 2017/0185211 A1* | 6/2017 | Lu | G06F 3/0412 |
| 2017/0194364 A1* | 7/2017 | Zhai | H01L 27/1255 |
| 2017/0329448 A1* | 11/2017 | Li | G06F 3/0412 |
| 2018/0039362 A1* | 2/2018 | Liu | G02F 1/13338 |
| 2018/0129343 A1* | 5/2018 | Zhai | G06F 3/0416 |
| 2018/0150175 A1* | 5/2018 | Li | G06F 3/0412 |
| 2018/0157373 A1* | 6/2018 | Tu | G09G 3/20 |
| 2018/0210600 A1* | 7/2018 | Lee | G06F 3/0416 |
| 2018/0232092 A1* | 8/2018 | Lee | G06F 3/0414 |

\* cited by examiner

FLEXIBLE ORGANIC LIGHT-EMITTING DISPLAY PANEL AND ELECTRONIC DEVICE

CROSS-REFERENCE TO RELATED APPLICATIONS

This application claims priority to Chinese Patent Application No. 201710523163.1, filed on Jun. 30, 2017 and entitled "FLEXIBLE ORGANIC LIGHT-EMITTING DISPLAY PANEL AND ELECTRONIC DEVICE", the disclosure of which is incorporated herein by reference in its entirety.

TECHNICAL FIELD

The present disclosure relates to display technologies, and in particular, to a flexible organic light-emitting display panel and an electronic device.

BACKGROUND

With the rapid development of the technologies of portable electronic terminal devices, especially mobile phones and tablets, more and more novel technologies are applied to the electronic terminal devices. Currently, a pressure-sensitive touch technology is one of the novel technologies which may cause concerns in the field. Touch screens integrated with the pressure-sensitive touch screen technology may clearly distinguish between a touch action and a press action. When a user presses a screen, the touch screen integrated with a pressure sensor can exactly identify the pressure transferred by the user on the touch surface, thereby realizing different operations, for example, calling more control options in applications such as Message, Music and Calendar, etc. The existing pressure sensor is generally integrated on the periphery of a display to detect whether the display is pressed and detect the magnitude of the pressure.

A flexible touch screen is also a novel technology for wide attention currently. However, when an existing pressure sensor is integrated in a flexible touch screen, it can only detect whether the flexible touch screen is pressed and detect the magnitude of the pressure, but cannot detect whether the flexible touch screen is bent.

BRIEF SUMMARY

Embodiments of the present disclosure provide a flexible organic light-emitting display panel and an electronic device, thereby realizing both detection for a bend action and detection for a press action.

In a first aspect, embodiments of the application provide a flexible organic light-emitting display panel, which comprises: a display region and a non-display region surrounding the display region, wherein the non-display region includes a bendable region and a non-bendable region; at least one metal bridge pressure-sensitive detection unit, which is at least partially provided in the bendable region and extends along a bending direction of the flexible organic light-emitting display panel; and a plurality of semiconductor pressure-sensitive detection units, wherein at least one of the plurality of semiconductor pressure-sensitive detection units is provided in the non-bendable region.

In a second aspect, embodiments of the disclosure further provide an electronic device, which comprises the above flexible organic light-emitting display panel.

In the embodiments of the disclosure, the metal bridge pressure-sensitive detection unit is at least partially provided in the bendable region, and based on the metal bridge pressure-sensitive detection unit with an excellent bending resistance, not only the bending requirement of the flexible organic light-emitting display panel can be met, but also the bent state and the bending degree of the flexible organic light-emitting display panel can be effectively detected, so that bending detection on the flexible organic light-emitting display panel can be realized, and it is favorable for improving product reliability; moreover, at least one of the semiconductor pressure-sensitive detection units is provided in the non-bendable region, and the semiconductor pressure-sensitive detection unit made of a semiconductor material has the advantages of high sensitivity and strong press-sensing capability, so that it can effectively detect whether the flexible organic light-emitting display panel is pressed and detect the pressing degree thereof, and hence pressure detection on the flexible organic light-emitting display panel can be realized, and it is favorable for improving the induction sensitivity of the product. In the embodiments of the disclosure, different pressure-sensitive detection units are provided in different regions of the flexible organic light-emitting display panel, thereby realizing functions of both bending detection and press detection.

BRIEF DESCRIPTION OF THE DRAWINGS

Drawings associated with the embodiments of the disclosure will be introduced briefly below for more clearly illustrating the technical solutions of the exemplary embodiments of the disclosure. It will be apparent that, the drawings merely illustrate exemplary embodiments of the disclosure. Those skilled in the art can conceive other drawings from the illustrated drawings without inventive efforts.

DETAILED DESCRIPTION

Figure 1A:
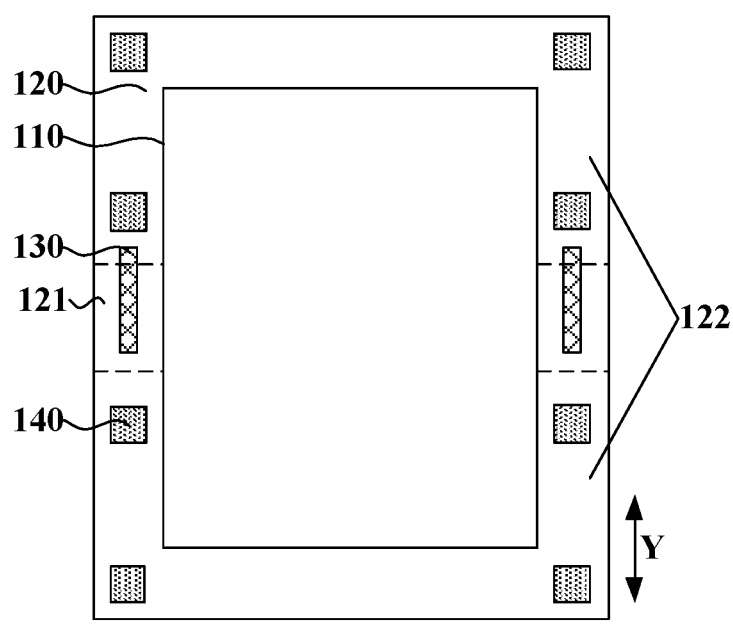
FIG. 1A is a schematic diagram of a flexible organic light-emitting display panel according to an embodiment of the disclosure.

In order to make the objectives, technical solutions and advantages of the invention more apparent, the technical solution of the invention will be clearly and fully described via the embodiments by referring to the drawings of the embodiments of the invention. Apparently, the embodiments described are only a part of the embodiments of the invention, rather than being the whole embodiment. All other embodiments made by one of ordinary skills in the art based on the embodiments in the invention without creative work will pertain to the protection scope of the invention.

Figure 1B:
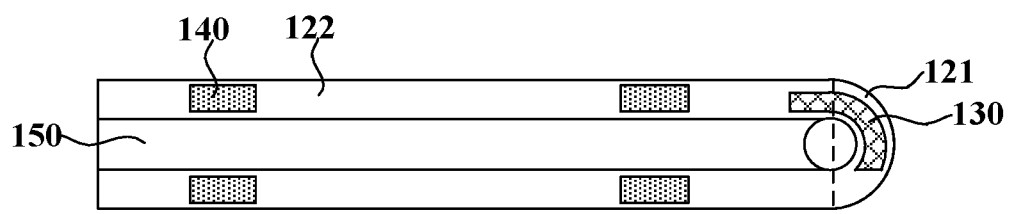
FIG. 1B is a schematic diagram showing a bent state of the flexible organic light-emitting display panel shown in FIG. 1A.

Referring to FIG. 1A, a flexible organic light-emitting display panel according to an embodiment of the disclosure includes: a display region 110 and a non-display region 120 surrounding the display region 110, wherein the non-display region 120 includes a bendable region 121 and a non-bendable region 122; at least one metal bridge pressure-sensitive detection unit 130, which is at least partially provided in the bendable region 121 and extends along the bending direction Y of the flexible organic light-emitting display panel; and a plurality of semiconductor pressure-sensitive detection units 140, at least one of which is provided in the non-bendable region 122. In an embodiment of the disclosure, the flexible organic light-emitting display panel can display in both a bent state and a planar state. Optionally, the flexible organic light-emitting display panel has two non-bendable regions 122 and one bendable region 121 between the two non-bendable regions 122, as shown in FIG. 1B, the bendable region 121 is bent in the flexible organic light-emitting display panel.

Optionally, the non-bendable region 122 of the flexible organic light-emitting display panel is further provided with a rigid supporting structure 150, which is configured to support the non-bendable region 122 of the flexible organic light-emitting display panel to prevent the non-bendable region 122 from being bent and deformed too much.

In an embodiment of the disclosure, in the metal bridge pressure-sensitive detection unit 130, a metal material is employed to manufacture a variable resistor, and the metals are connected via metallic bonds and hence have an excellent ductility. Therefore, the metal bridge pressure-sensitive detection unit 130 made of a metal material has an advantage of good bending resistance. The bendable region 121 of the flexible organic light-emitting display panel may be bent, and the bending degree thereof may be large. The excellent bending resistance of the metal bridge pressure-sensitive detection unit 130 provided at least partially in the bendable region 121 can meet the bending requirement of the flexible organic light-emitting display panel.

In an embodiment of the disclosure, the metal bridge pressure-sensitive detection unit 130 is at least partially provided in the bendable region 121 and extends along the bending direction Y of the flexible organic light-emitting display panel, and the non-display region 120 is divided into a bendable region 121 and a non-bendable region 122. Also, the metal bridge pressure-sensitive detection unit 130 is at least partially provided in the non-bendable region 122, that is, the metal bridge pressure-sensitive detection unit 130 covers at least a part of the bendable region 121 and at least a part of the non-bendable region 122. The bending degree of the bendable region 121 in the flexible organic light-emitting display panel is large, and the bending degree of the non-bendable region 121 in the flexible organic light-emitting display panel is small, so that the metal bridge pressure-sensitive detection unit 130 covers the bendable region 121 and the non-bendable region 122 which have different bending degrees from each other, and based on the metal bridge pressure-sensitive detection unit 130 with an excellent bending resistance, not only can the bending requirement of the flexible organic light-emitting display panel be met, but also the bent state and the bending degree of the bendable region 121 of the flexible organic light-emitting display panel can be effectively detected.

The metal bridge pressure-sensitive detection unit 130 includes two voltage input terminals and two voltage output terminals. The four resistors form a Wheatstone bridge structure. The flexible organic light-emitting display panel applies the same drive input voltage to the metal bridge pressure-sensitive detection units 130. When the flexible organic light-emitting display panel is in a planar state, the Wheatstone bridge keeps a balanced state, and the detection output voltage on the voltage output terminal of each metal bridge pressure-sensitive detection unit 130 is 0V. When the flexible organic light-emitting display panel is bent, the resistance value of the four resistors of the metal bridge pressure-sensitive detection unit 130 will be changed according to the corresponding bending degree, and at this time, the Wheatstone bridge will be in an unbalanced state, and the detection output voltage on the voltage output terminal of the metal bridge pressure-sensitive detection unit 130 will not be 0. The flexible organic light-emitting display panel detects the voltage output terminal of each metal bridge pressure-sensitive detection unit 130 to acquire the detection output voltage on each metal bridge pressure-sensitive detection unit 130, so that it may determine whether the flexible organic light-emitting display panel is bent and determine the bending degree thereof according to the magnitude of the detection output voltage on each metal bridge pressure-sensitive detection unit 130.

Therefore, the metal bridge pressure-sensitive detection unit 130 can realize bending detection on the flexible organic light-emitting display panel. When the flexible organic light-emitting display panel is bent, the strain of the bendable region 121 is large, so that the bending resistance of the metal bridge pressure-sensitive detection unit 130 provided in the bendable region 121 of the flexible organic light-emitting display panel is favorable for improving the product reliability.

In an embodiment of the disclosure, in the semiconductor pressure-sensitive detection unit 140, a semiconductor material is employed to manufacture a variable resistor, the semiconductor material may optionally be a non-crystal material or a polysilicon material. The semiconductor pressure-sensitive detection unit 140 specifically includes a semiconductor material film, two input terminals and two output terminals, wherein the input terminal is configured to receive a bias voltage signal, and the output terminal is configured to output a strain voltage signal. When the semiconductor pressure-sensitive detection unit 140 deforms due to pressure, the strain voltage signal it outputs will change correspondingly according to the deformation, so that pressure detection may be performed according to the strain voltage signal.

In an embodiment of the disclosure, the semiconductor pressure-sensitive detection unit 140 made of a semiconductor material has advantages of high sensitivity and strong press-sensing capability. The semiconductor pressure-sensitive detection unit 140 is at least provided in the non-bendable region 122, so that the semiconductor pressure-sensitive detection unit 140 with a high sensitivity can effectively detect whether the flexible organic light-emitting display panel is pressed and detect the pressing degree thereof.

Therefore, the semiconductor pressure-sensitive detection unit 140 can realize pressure detection on the flexible organic light-emitting display panel. When the flexible organic light-emitting display panel is pressed, the strain of the non-bendable region 122 is small, so that the high sensitivity of the semiconductor pressure-sensitive detection unit 140 in the non-bendable region 122 of the flexible organic light-emitting display panel is favorable for improving the induction sensitivity of the product.

In an embodiment of the disclosure, the metal bridge pressure-sensitive detection unit is at least partially located in the bendable region. Based on the metal bridge pressure-sensitive detection unit with an excellent bending resistance, not only the bending requirement of the flexible organic light-emitting display panel can be met, but also the bent state and the bending degree of the flexible organic light-emitting display panel can be effectively detected, so that bending detection on the flexible organic light-emitting display panel can be realized, which is favorable for improving product reliability. Moreover, the semiconductor pressure-sensitive detection unit is provided at least in the non-bendable region, and the semiconductor pressure-sensitive detection unit made of a semiconductor material has the advantages of high sensitivity and strong press-sensing capability, so that it can effectively detect whether the flexible organic light-emitting display panel is pressed and detect the pressing degree thereof. Hence pressure detection on the flexible organic light-emitting display panel can be realized, which is favorable for improving the induction sensitivity of the product. In an embodiment of the disclosure, different pressure-sensitive detection units are provided in different regions of the flexible organic light-emitting display panel, thereby realizing different functions of bending detection and press detection.

Figure 2:
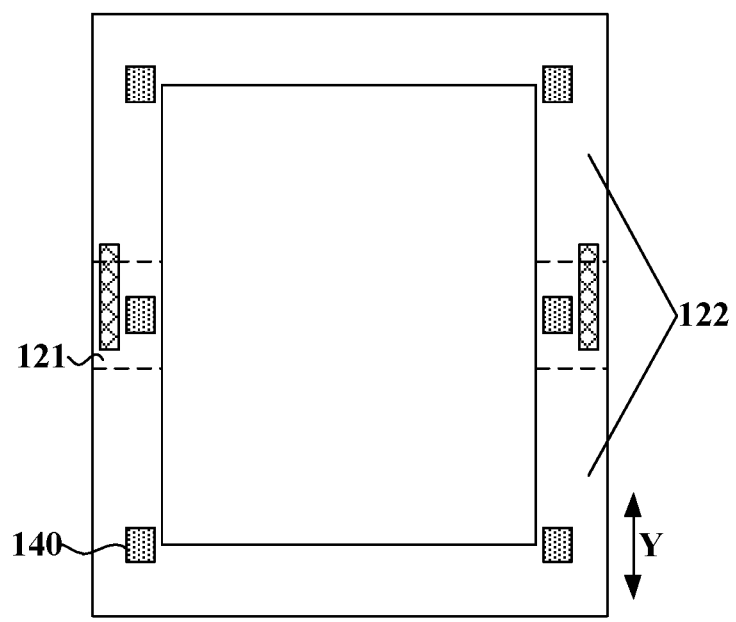
FIG. 2-FIG. 3 are schematic diagrams of two flexible organic light-emitting display panels according to the embodiments of the disclosure.

In a particular embodiment, referring to FIG. 2, in this embodiment of the disclosure, the difference from the above flexible organic light-emitting display panel lies in that, at least one semiconductor pressure-sensitive detection unit 140 is provided in the bendable region 121. The semiconductor pressure-sensitive detection unit 140 has a high press-sensing sensitivity, and the semiconductor pressure-sensitive detection unit 140 provided in the bendable region 121 can detect with high accuracy whether the bendable region 121 of the flexible organic light-emitting display panel is pressed and detect the pressing degree thereof. The semiconductor pressure-sensitive detection unit 140 provided in the non-bendable region 122 can detect with high sensitivity whether the non-bendable region 122 of the flexible organic light-emitting display panel is pressed and detect the pressing degree thereof. By a combination of the semiconductor pressure-sensitive detection units 140 provided in the bendable region 121 and the non-bendable region 122, pressure detection on the flexible organic light-emitting display panel can be realized. As shown in FIG. 2, optionally, the flexible organic light-emitting display panel is provided with three pairs of semiconductor pressure-sensitive detection units 140, and the bendable region 121 of the flexible organic light-emitting display panel is provided with one pair of semiconductor pressure-sensitive detection units 140.

Figure 3:
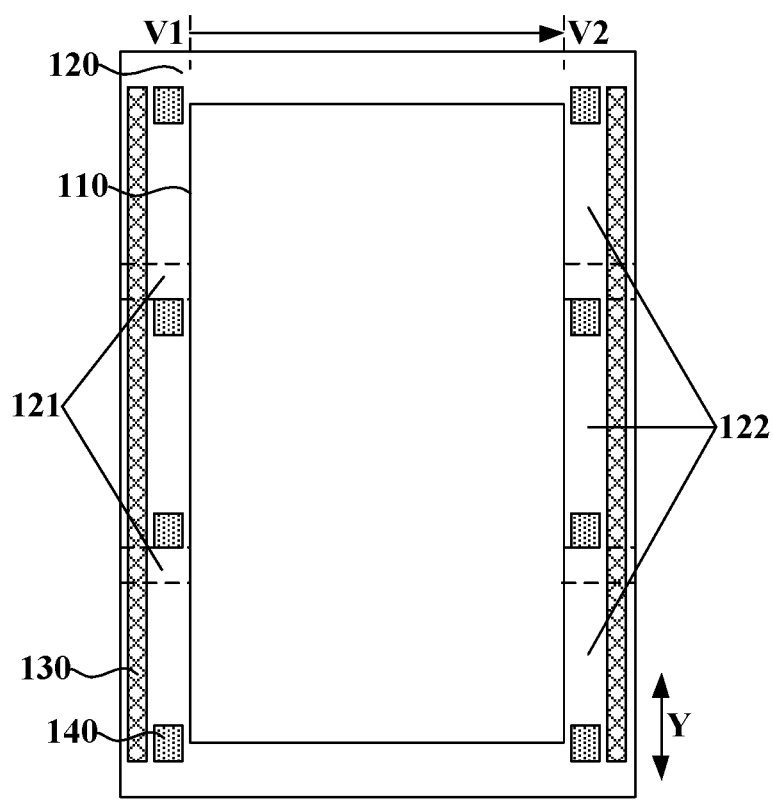

In a particular embodiment, referring to FIG. 3, in this embodiment of the disclosure, the difference from any of the above flexible organic light-emitting display panels lies in that, the display region 110 has a first side V1 and a second side V2 opposite to each other. The direction in which the first side V1 of the display region 110 points to the second side V2 is vertical to the bending direction Y of the flexible organic light-emitting display panel. The non-display region 120 includes a plurality of bendable regions 121 and a plurality of non-bendable regions 122 that are arranged alternately. At least one of a plurality of semiconductor pressure-sensitive detection units 140 is provided in the non-display region 120 on the first side V1 of the display region 110 and at least one of the plurality of semiconductor pressure-sensitive detection units 140 provided in the non-display region 120 on the second side V2 of the display region 110. At least one metal bridge pressure-sensitive detection unit 130 extends and pass through the plurality of bendable regions 121 and the plurality of non-bendable regions 122.

The flexible organic light-emitting display panel may be a display panel having a bendable region as shown in FIG. 1A. That is, the non-display region of the flexible organic light-emitting display panel includes two non-bendable regions 122 and one bendable region 121 provided between the two non-bendable regions 122. The flexible organic light-emitting display panel may also be a display panel having a plurality of bendable regions as shown in FIG. 3. That is, the non-display region 120 of the flexible organic light-emitting display panel includes a plurality of bendable regions 121 and a plurality of non-bendable regions 122 that are arranged alternately.

As shown in FIG. 3, a plurality of semiconductor pressure-sensitive detection units 140 may be distributed in the non-display region 120 on the first side V1 of the display region 110 and the non-display region 120 on the second side V2 of the display region 110, so that the plurality of semiconductor pressure-sensitive detection units 140 can perform pressure detection on different regions of the flexible organic light-emitting display panel simultaneously. Moreover, the metal bridge pressure-sensitive detection unit 130 can extend and pass through a plurality of bendable regions 121 and a plurality of non-bendable regions 122, so that when the plurality of bendable regions 121 in the flexible organic light-emitting display panel are bent, the metal bridge pressure-sensitive detection unit 130 can perform bending detection on the plurality of bendable regions 121 in the flexible organic light-emitting display panel simultaneously.

Figure 4:
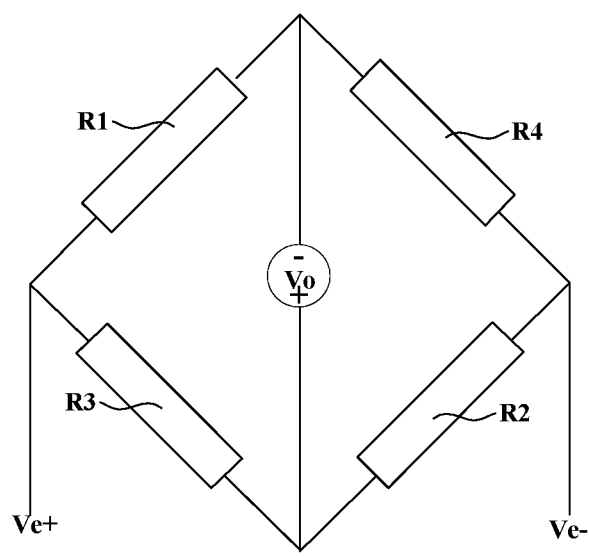
FIG. 4 is a schematic diagram of a metal bridge pressure-sensitive detection unit according to an embodiment of the disclosure.

In a particular embodiment, referring to FIG. 4, in an embodiment of the disclosure, the metal bridge pressure-sensitive detection unit 130 includes a first resistor R1, a second resistor R2, a third resistor R3 and a fourth resistor R4. The first end of the first resistor R1 is electrically connected with the first end of the third resistor R3, the second end of the first resistor R1 is electrically connected with the first end of the fourth resistor R4, the first end of the second resistor R2 is electrically connected with the second end of the third resistor R3, and the second end of the second resistor R2 is electrically connected with the second end of the fourth resistor R4. The first end of the first resistor R1 and the first end of the third resistor R3 function as a detection output positive pole Ve+, the second end of the second resistor R2 and the second end of the fourth resistor R4 function as a detection output negative pole Ve−, the first end of the second resistor R2 and the second end of the third resistor R3 function as a drive input positive pole Vo+, and the second end of the first resistor R1 and the first end of the fourth resistor R4 function as a drive input negative pole Vo−.

The metal bridge pressure-sensitive detection unit 130 includes four resistors, two drive input terminals and two detection output terminals. The four resistors form a Wheatstone bridge structure, wherein, the resistance value of the first resistor R1 is Rr1, the resistance value of the second resistor R2 is Rr2, the resistance value of the third resistor R3 is Rr3, and the resistance value of the fourth resistor R4 is Rr4. When the flexible organic light-emitting display panel is not bent, the Wheatstone bridge keeps in a balanced state, that is, Rr1/Rr4=Rr3/Rr2, and the drive input voltage of the metal bridge pressure-sensitive detection unit 130 is equal to 0V. When the flexible organic light-emitting display panel is bent, the resistance values of the four resistors of the metal bridge pressure-sensitive detection unit 130 will change, so that the Wheatstone bridge will be in an unbalanced state, that is, Rr1/Rr4≠Rr3/Rr2, and the drive input voltage of the metal bridge pressure-sensitive detection unit 130 will not be equal to the detection output voltage. Therefore, the voltage output on the detection output terminal of the metal bridge pressure-sensitive detection unit 130 can be detected, and bending detection on the flexible organic light-emitting display panel can be realized.

Figure 5A:
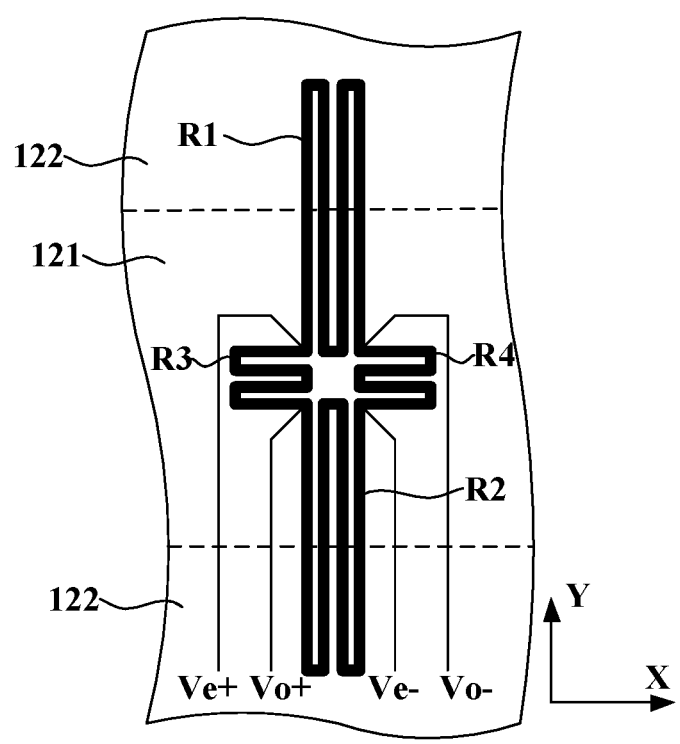
FIG. 5A-FIG. 5B are schematic diagrams of two metal bridge pressure-sensitive detection units according to the embodiments of the disclosure.

In a particular embodiment, referring to FIG. 5A, each resistor in the metal bridge pressure-sensitive detection unit 130 takes a form of a serpentine metal film wiring. The four serpentine metal film wiring resistors of the metal bridge pressure-sensitive detection unit 130 are concentrated, and the advantage thereof lies in that: when a temperature change occurs locally, the temperature affect on each resistor will be uniform, so that the affect of the temperature effect may be eliminated to a certain extent, and the unbalance of the Wheatstone bridge caused by different temperatures of the resistors would nullified.

Optionally, the wire resistance Rx1 of the first resistor R1 is equal to the wire resistance Rx2 of the second resistor R2, and the wire resistance Rx3 of the third resistor R3 is equal to the wire resistance Rx4 of the fourth resistor R4. The resistance value of resistor body $Rr=\rho*L/S$, wherein $\rho$ is the resistivity of the resistor material, L is the length of the resistor body, and S is the sectional area of the resistor body. If length of the resistor body is L, the width is w, and the height is d (i.e., the film thickness), then S=w*d, and hence $Rr=\rho*L/(w*d)=(\rho/d)*(L/w)$. if let L=w, then $Rs=\rho/d$ and $Rr=Rs*L/w$, wherein Rs is a square resistance, which refers to the resistance of a square with a length and a width equal to each other, the square resistance Rs is related to the metal film material and the metal film thickness, and under the same thickness, the smaller the conductivity of the metal film material is, the larger the square resistance Rs will be, and the larger the conductivity of the metal film material is, the smaller the square resistance Rs will be. If L=1 (unit length), then $Rx=\rho/(w*d)=Rs/w$ and $Rr=Rx*L$, wherein Rx is the wire resistance, which refers to the resistance of a resistor body with a unit length. The wire resistance Rx is related to the square resistance Rs and the wiring width w; under the same square resistance Rs, the larger the wiring width w of the metal film wiring is, the smaller the wire resistance Rx will be, and the smaller the wiring width w of the metal film wiring is, the larger the wire resistance Rx will be. Under the same wiring width w, the smaller the square resistance Rs of the metal film material is the smaller the wire resistance Rx will be, and the larger the square resistance Rs of the metal film material is the larger the wire resistance Rx will be.

In an embodiment of the disclosure, since each of the first, second, third and fourth resistors (R1-R4) takes a form of a serpentine metal film wiring, the resistance values of R1-R4 (Rr1-Rr4) may be characterized by the wire resistance Rx, so that the resistance value Rr of the resistor R is equal to the product of the wire resistance Rx and the wiring length L. It is known that Rr=Rx*L, so that the resistance value Rr is related to the wire resistance Rx and the wire length L (wiring length). Under the same wire resistance Rx, the larger the wire length L of the metal film wiring the larger the resistance value Rr will be. Similarly, the smaller the wire length L of the metal film wiring is the smaller the resistance value Rr will be. Under the same wire length L, the smaller the wire resistance Rx of the metal film material is the smaller the resistance value Rr will be. Similarly, the larger the wire resistance Rx of the metal film material is, the larger the resistance value Rr will be.

Optionally, the wire resistance Rx1 of the first resistor R1 is less than the wire resistance Rx3 of the third resistor R3, and/or, any one of the wiring length L1 of the first resistor R1 and the wiring length L2 of the second resistor R2 is larger than any one of the wiring length L3 of the third resistor R3 and the wiring length L4 of the fourth resistor R4. When the Wheatstone bridge is kept balanced, Rr1/Rr4=Rr3/Rr2 and Rr=Rx*L, then the four resistors may be kept balanced by adjusting the wire resistance and the wiring length of each resistor in the metal bridge pressure-sensitive detection unit 130. In an embodiment of the disclosure, optionally, under the condition that the Wheatstone bridge is kept balanced, that is, Rr1/Rr4=Rr3/Rr2, the resistance values of R1-R4 may be different from or the same with each other. Optionally, if it is assumed that the difference between the resistance values of R1-R4 is small, then the wiring length of the resistor among R1-R4 which has a small wire resistance is large, and the wiring length of the resistor which has a large wire resistance is small. For example, optionally, Rx1=Rx2<Rx3=Rx4 and L1=L2>L3=L4. The resistors with a large wiring length are favorable for crossing the bendable region 121 and the non-bendable region 122, and the resistors with a small wiring length are favorable for being arranged in a bendable region 121 having a small area. It may be understood by one skilled in the art that, under the condition that the Wheatstone bridge is kept balanced, that is, Rr1/Rr4=Rr3/Rr2, the wire resistance and the wiring length of each resistor in the metal bridge pressure-sensitive detection unit may be designed autonomously, which will not be specifically limited in the disclosure Optionally, referring to FIG. 5A, the metal film material employed by the resistor with a small wire resistance includes aluminum, and the metal film material employed by the resistor with a large wire resistance includes molybdenum or constantan. In other words, R1 and R2 is made of aluminum to manufacture the metal film wiring, and R3 and R4 are made of molybdenum or constantan to manufacture the metal film wiring. The square resistance of the aluminum metal film material is less than the square resistance of the molybdenum metal film material or the square resistance of the constantan metal film material. It is known that the square resistance $Rs=\rho/d$, so that the square resistance Rs is related to the metal film material and the metal film thickness, and also it is known that the wire resistance $Rx=\rho/(w*d)=Rs/w$, so that the wire resistance Rx is related to the square resistance Rs and the wiring width w. Therefore, in the case that the wiring width is constant, the wire resistance may be adjusted by selecting different metal film materials. The square resistance Rs1 of the film material employed by R1 is equal to the square resistance Rs2 of the film material employed by R2, and the square resistance Rs3 of the film material employed by R3 is equal to the square resistance Rs4 of the film material employed by R4. That is, Rs1=Rs2, Rs3=Rs4 and Rs1<Rs3, thereby realizing that the wire resistance Rx1 of the first resistor R1 is less than the wire resistance Rx3 of the third resistor R3. However, it is within the scope of this disclosure for the film material of the resistor is not limited hereto, and based on the characteristics of R1-R4 and the balance feature of the Wheatstone bridge in the embodiments of the disclosure, one skilled in the art may autonomously select the metal film materials of R1-R4.

Figure 5B:
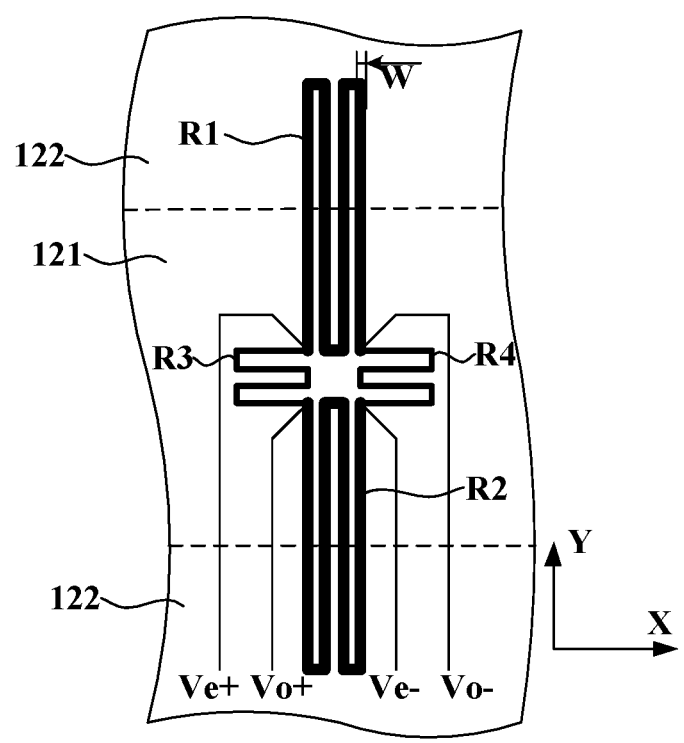

In a particular embodiment, referring to FIG. 5B, the difference between FIG. 5B and FIG. 5A lies in that, the wiring widths w of the first resistor R1, the second resistor R2, the third resistor R3 and the fourth resistor R4 are all 1 μm-100 μm. The wiring width of the resistor with a small wire resistance is larger than the wiring width of the resistor with a large wire resistance. In other words, the wiring width of each resistor of R1 and R2 is larger than the wiring width of each resistor of R3 and R4. It is known that the wire resistance Rx=Rs/w, so that the wire resistance Rx is related to the square resistance Rs and the wiring width w. Therefore, in the case that the square resistance Rs is constant (that is, R1-R4 may optionally employ the same metal film material), the wire resistance may be adjusted by changing the wiring width. The larger the wiring width is, the smaller the wire resistance will be, and similarly, the smaller the wiring width is, the larger the wire resistance will be, thereby realizing that the wire resistance Rx1 of the first resistor R1 is less than the wire resistance Rx3 of the third resistor R3. Based on the characteristics of R1-R4 and the balance feature of the Wheatstone bridge in the embodiments of the disclosure, one skilled in the art may autonomously select the wiring widths of R1-R4.

Optionally, referring to FIG. 5A-FIG. 5B, the first resistor R1 and the second resistor R2 both extend along the bending direction Y of the flexible organic light-emitting display panel, and the third resistor R3 and the fourth resistor R4 both extend along the bending axis X direction of the flexible organic light-emitting display panel. Furthermore, at least a part of each of the first resistor R1 and the second resistor R2 is provided in the bendable region 121, and the third resistor R3 and the fourth resistor R4 are both provided in the bendable region 121. The bending direction Y and the bending axis X direction intersect vertically with each other. As shown in FIG. 5A-FIG. 5B, the wiring of R1 and the wiring of R2 cross both the bendable region 121 and the non-bendable region 122. The wiring of R3 and the wiring of R4 are both provided in the bendable region 121. The extension direction of both R1 and R2 is Y, and the extension direction of both R3 and R4 is X, and X and Y intersect vertically.

Referring to FIG. 5A-FIG. 5B, R1 and R2 cross the bendable region 121 and the non-bendable region 122, and R3 and R4 are only provided in the bendable region 121. When the flexible organic light-emitting display panel is bent and deformed along the bending direction Y, the bending strain of the bendable region 121 is large and the bending strain of the non-bendable region 122 is small. Because the bending direction Y of the flexible organic light-emitting display panel is parallel to the extension direction of R1 and R2 and the bending direction Y of the flexible organic light-emitting display panel is vertical to the extension direction of R3 and R4. When the flexible organic light-emitting display panel is bent and deformed along the bending direction Y, the resistance value of the R1 and R2 crossing the bendable region 121 and the non-bendable region 122 changes greatly, but the resistance value of the R3 and R4 that are only arranged in the bendable region 121 and have an extension direction vertical to the bending direction Y changes little. In conjunction with the equilibrium formula of the Wheatstone bridge, i.e., Rr1/Rr4=Rr3/Rr2, because the four resistors in the metal bridge pressure-sensitive detection unit 130 change differently, the Wheatstone bridge will be unbalanced, and the detection output voltage of the metal bridge pressure-sensitive detection unit 130 changes. It may determine whether the flexible organic light-emitting display panel is bent and determine the bending degree thereof by detecting the detection output voltage of the metal bridge pressure-sensitive detection unit 130 and according to the magnitude of the detection output voltage. The larger the detection output voltage changes relative to the drive input voltage the larger the bending degree will be. Similarly, the smaller the detection output voltage changes relative to the drive input voltage the smaller the bending degree will be.

It needs to be noted that, in the Wheatstone bridge, the extension directions of the two resistors in a diagonal state are uniform (Y), and the extension direction of the other two resistors in a diagonal state are uniform (X), wherein X is vertical to Y, so that when deformation is caused along the X or Y direction, the unbalance of the Wheatstone bridge will be speeded up, and hence the deformation state can be detected more precisely.

Figure 6:
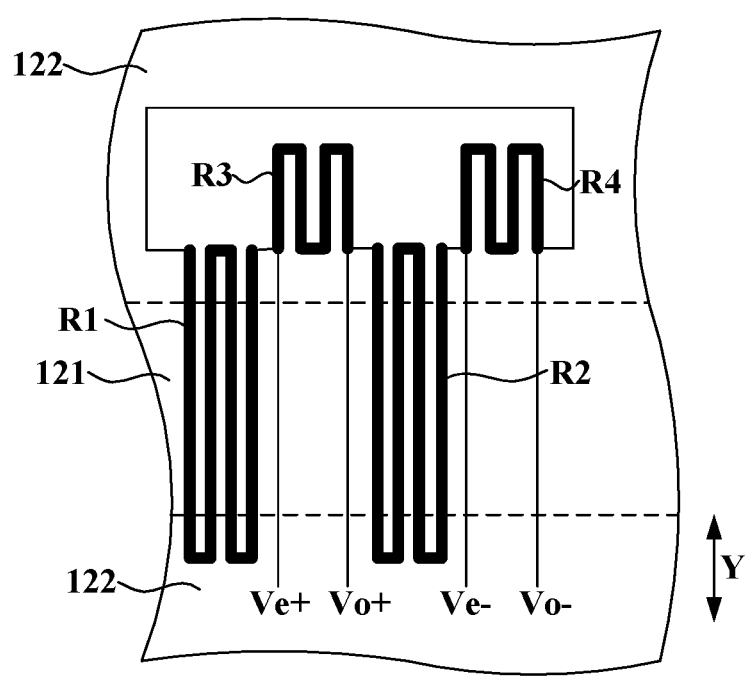
FIG. 6 is a schematic diagram of a metal bridge pressure-sensitive detection unit according to an embodiment of the disclosure.

In a particular embodiment, referring to FIG. 6, the difference from FIG. 5A-FIG. 5B lies in that, in the metal bridge pressure-sensitive detection unit 130 shown in FIG. 6, the first resistor R1, the second resistor R2, the third resistor R3 and the fourth resistor R4 all extend along the bending direction Y of the flexible organic light-emitting display panel. At least a part of each of the first resistor R1 and the second resistor R2 is provided in the bendable region 121, and each of the third resistor R3 and the fourth resistor R4 is provided in the non-bendable region 122. As shown in FIGS. 6, R1 and R2 cross the bendable region 121 and the non-bendable region 122, and R3 and R4 are only arranged in the non-bendable region 122. When the flexible organic light-emitting display panel is bent and deformed along the bending direction Y, the bending strain of the bendable region 121 is large and the bending strain of the non-bendable region 122 is small.

The bending direction Y of the flexible organic light-emitting display panel is parallel to the extension direction of the four resistors in the metal bridge pressure-sensitive detection unit 130. When the flexible organic light-emitting display panel is bent and deformed along the bending direction Y the resistance value of a part of the resistor of R1 located in the bendable region 121 with a large bending strain changes greatly and the resistance value of a part of the resistor of R1 located in the non-bendable region 122 with a small bending strain changes relatively small, so that the change of the resistance value of R1 is large, and similarly, the change of the resistance value of R2 is large; R3 is entirely located in the non-bendable region of 121 with a small bending strain, and the change of the resistance value thereof is very small, and similarly, the change of the resistance value of R4 is very small.

In conjunction with the equilibrium formula of the Wheatstone bridge, i.e., Rr1/Rr4=Rr3/Rr2, because the resistance values of the four resistors in the metal bridge pressure-sensitive detection unit 130 change differently, the Wheatstone bridge will be unbalanced, and the detection output voltage of the metal bridge pressure-sensitive detection unit 130 changes. It may determine whether the flexible organic light-emitting display panel is bent and determine the bending degree thereof by detecting the detection output voltage of the metal bridge pressure-sensitive detection unit 130 and according to the magnitude of the detection output voltage. The larger the detection output voltage changes relative to the drive input voltage the larger the bending degree will be. Similarly the smaller the detection output voltage changes relative to the drive input voltage the smaller the bending degree will be.

Figure 7A:
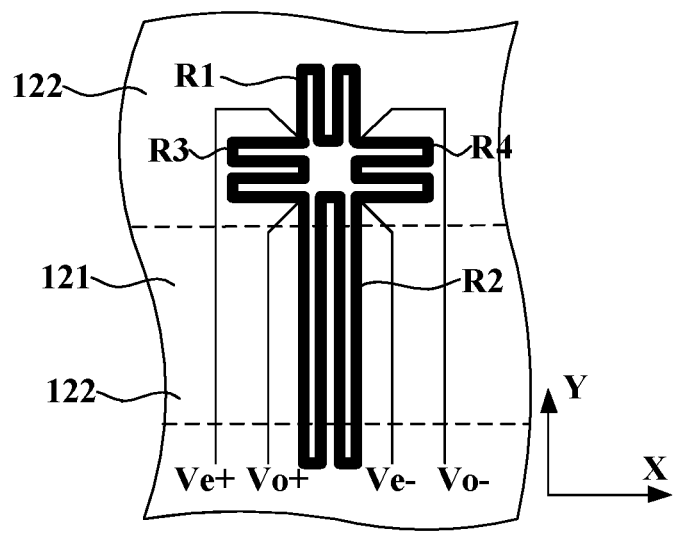
FIG. 7A-FIG. 7B are schematic diagrams of two metal bridge pressure-sensitive detection units according to the embodiments of the disclosure.

In a particular embodiment, referring to FIG. 7A, each resistor in the metal bridge pressure-sensitive detection unit 130 takes a form of a serpentine metal film wiring. The four resistors of the metal bridge pressure-sensitive detection unit 130 with serpentine metal film wiring resistors are concentrated, and the advantage thereof lies in that: when a temperature change occurs locally, the temperature effect on each resistor will be uniform, and hence the effect of the temperature effect may be eliminated to a certain extent, and the unbalance of the Wheatstone bridge caused due to different temperatures of each resistor will be curtailed.

Optionally, the wire resistance Rx1 of the first resistor R1, the wire resistance Rx3 of the third resistor R3 and the wire resistance Rx4 of the fourth resistor R4 are equal to each other, and the wire resistance of the first resistor R1 and the wire resistance Rx2 of the second resistor R2 are not equal to each other. Optionally, the wire resistance Rx1 of the first resistor R1 is larger than the wire resistance Rx2 of the second resistor R2, and/or, any one of the wiring length L3 of the third resistor R3 and the wiring length L4 of the fourth resistor R4 is less than the wiring length L2 of the second resistor R2. When the Wheatstone bridge is kept balanced, Rr1/Rr4=Rr3/Rr2 and Rr=Rx*L, so that the four resistors may be kept balanced by adjusting the wire resistance Rx and the wiring length L of each resistor in the metal bridge pressure-sensitive detection unit 130. In an embodiment of the disclosure, optionally, under the condition that the Wheatstone bridge is kept balanced, that is, Rr1/Rr4=Rr3/Rr2, the resistance values of R1-R4 may be different from or the same with each other. Here, optionally, the difference between the resistance values of R1-R4 is small, thus the wiring length of the resistor with a mall wire resistance in R1-R4 is large, and the wiring length of the resistor with a large wire resistance is small. For example, optionally, Rx2<Rx1=Rx3=Rx4 and L2>L1=L3=L4. Resistors with a large wiring length are favorable for crossing the bendable region 121 and the non-bendable region 122, and resistors with a small wiring length are favorable for being entirely arranged in the non-bendable region 122 or the bendable region 121. It may be understood by one skilled in the art that, under the premise that the Wheatstone bridge is kept balanced, that is, Rr1/Rr4=Rr3/Rr2, the wire resistance and the wiring length of each resistor in the metal bridge pressure-sensitive detection unit may be designed autonomously, which will not be specifically limited in the disclosure.

Optionally, a metal film material employed by the resistor with a small wire resistance includes aluminum, and a metal film material employed by the resistor with a large wire resistance includes molybdenum or constantan. In other words, R2 is made of aluminum to manufacture the metal film wiring, and R1, R3 and R4 is made of molybdenum or constantan to manufacture the metal film wiring, wherein, the square resistance of the aluminum metal film material is less than the square resistance of the molybdenum metal film material or the square resistance of the constantan metal film material. The wire resistance Rx is related to the square resistance Rs and the wiring width w, and in the case that the wiring width is constant, the wire resistance may be adjusted by selecting different metal film materials. The square resistance Rs2 of the film material employed by R2 is small, and the square resistance Rs1 of the film material employed by R1, the square resistance Rs3 of the film material employed by R3 and the square resistance Rs4 of the film material employed by R4 are equal to each other and larger than Rs2, that is, Rs1=Rs3=Rs4 and Rs2<Rs1, thereby realizing that the wire resistance Rx1 of the first resistor R1 is larger than the wire resistance Rx2 of the second resistor R2. However, in the disclosure, the film material of the resistor is not limited hereto, and based on the characteristics of R1-R4 and the balance feature of the Wheatstone bridge in the embodiments of the disclosure, one skilled in the art may autonomously select the metal film materials of R1-R4.

Figure 7B:
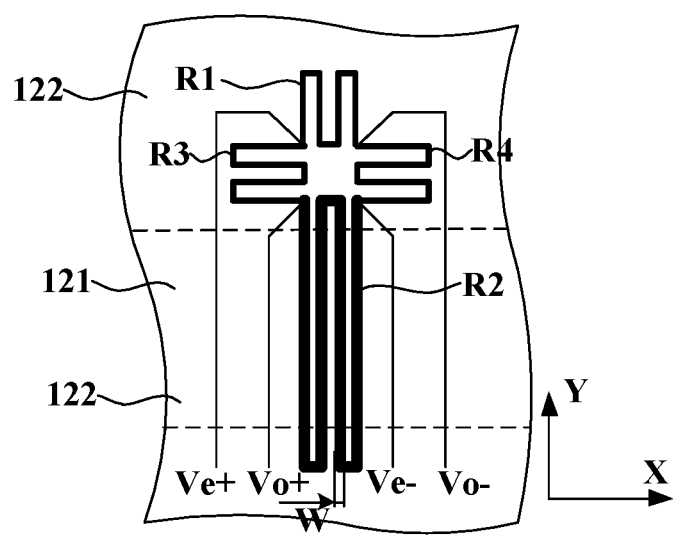

In a particular embodiment, referring to FIG. 7B, the wiring widths w of the first resistor R1, the second resistor R2, the third resistor R3 and the fourth resistor R4 are all 1 μm-100 μm. The wiring width of the resistor with a small wire resistance is larger than the wiring width of the resistor with a large wire resistance. In other words, the wiring width of R2 is larger than the wiring width of each resistor of R1, R3 and R4. It is known that the wire resistance Rx=Rs/w. In the case that the square resistance Rs is constant, the wire resistance may be adjusted by changing the wiring width and the larger the wiring width is, the smaller the wire resistance will be, and the smaller the wiring width is, and the larger the wire resistance will be, thereby realizing that the wire resistance Rx1 of the first resistor R1 is larger than the wire resistance Rx2 of the second resistor R2. Based on the characteristics of R1-R4 and the balance feature of the Wheatstone bridge in the embodiments of the disclosure, one skilled in the art may autonomously select the wiring widths of R1-R4.

In a particular embodiment, referring to FIG. 7A-7B, the first resistor R1 and the second resistor R2 both extend along the bending direction Y of the flexible organic light-emitting display panel, and the third resistor R3 and the fourth resistor R4 both extend along the bending axis X direction of the flexible organic light-emitting display panel. Each of the first resistor R1, the third resistor R3 and the fourth resistor R4 are arranged in the non-bendable region 122, and at least a part of the second resistor R2 is arranged in the bendable region 121, wherein, the bending direction Y and the bending axis X direction intersect vertically with each other. Referring to FIG. 7A-7B, the wiring of R2 crosses the bendable region 121 and the non-bendable region 122, and the wiring of R1, the wiring of R3 and the wiring of R4 are all provided in the non-bendable region 122, the extension direction of both R1 and R2 is Y, the extension direction of both R3 and R4 is X, and X and Y intersect vertically.

Referring to FIG. 7A-7B, R2 crosses the bendable region 121 and the non-bendable region 122, and R1, R3 and R4 are only provided in the non-bendable region 122. When the flexible organic light-emitting display panel is bent and deformed along the bending direction Y the bending strain of the bendable region 121 is large, and the bending strain of the non-bendable region 122 is small. Because the bending direction Y of the flexible organic light-emitting display panel is parallel to the extension direction of R1 and R2 and the bending direction Y of the flexible organic light-emitting display panel is vertical to the extension direction of R3 and R4, when the flexible organic light-emitting display panel is bent and deformed along the bending direction Y, the resistance value of R2 crossing the bendable region 121 and the non-bendable region 122 changes greatly. In addition, the change of the resistance value of R1 only arranged in the non-bendable region 122 is small relative to R2, and the change of the resistance value of R3 and R4 that are only arranged in the non-bendable region 122 and have an extension direction vertical to the bending direction Y is very small. In conjunction with the equilibrium formula of the Wheatstone bridge, i.e., Rr1/Rr4=Rr3/Rr2, because the four resistors in the metal bridge pressure-sensitive detection unit 130 change differently, the Wheatstone bridge will be unbalanced, and the detection output voltage of the metal bridge pressure-sensitive detection unit 130 changes. By detecting the detection output voltage of the metal bridge pressure-sensitive detection unit 130 and according to the magnitude of the detection output voltage it may be determined whether the flexible organic light-emitting display panel is bent and determine the bending degree thereof. The larger the detection output voltage changes relative to the drive input voltage the larger the bending degree will be, and similarly, the smaller the detection output voltage changes relative to the drive input voltage the smaller the bending degree will be.

Figure 8A:
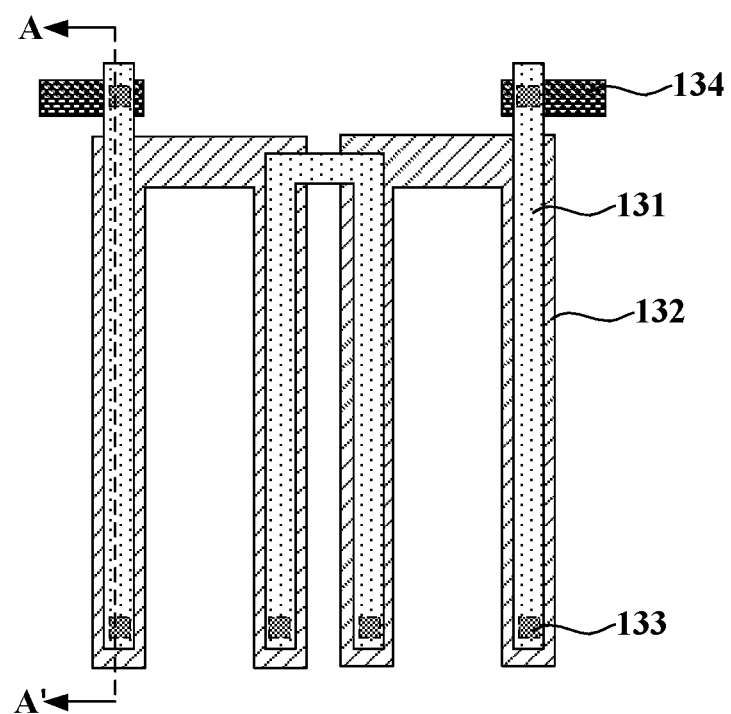
FIG. 8A is a schematic diagram of any resistor in the metal bridge pressure-sensitive detection unit according to an embodiment of the disclosure.
Figure 8B:
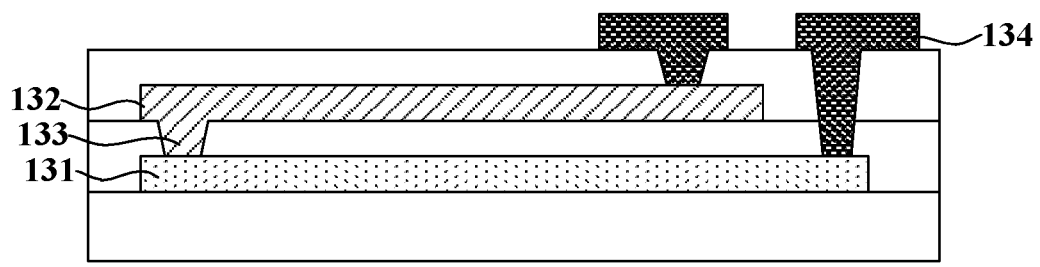
FIG. 8B is a sectional view taken along A-A' of FIG. 8A.

In a particular embodiment, referring to FIG. 8A and FIG. 8B, FIG. 8B is a sectional view taken along A-A' of FIG. 8A, in this embodiment of the disclosure, each resistor in the metal bridge pressure-sensitive detection unit 130 includes a first metal film wiring pattern 131 and a second metal film wiring pattern 132 that are stacked and insulated from each other. The first metal film wiring pattern 131 and the second metal film wiring pattern 132 are electrically connected by a via hole 133. In an embodiment of the disclosure, any variable resistor in the metal bridge pressure-sensitive detection unit 130 may be realized by a lateral backfolding structure and a longitudinal stack structure, which is favorable for increasing the wiring length of the resistor, reducing the area occupied by any variable resistor in the metal bridge pressure-sensitive detection unit 130, and creating a narrow frame. In each variable resistor of the metal bridge pressure-sensitive detection unit 130, optionally, the first metal film wiring pattern 131 is provided on the second metal film wiring pattern 132, or optionally, the second metal film wiring pattern 132 is provided on the first metal film wiring pattern 131. FIG. 8A and FIG. 8B further show a metal wiring 134 electrically connected with the metal bridge pressure-sensitive detection unit 130. The metal wiring 134 functions as a wiring electrically connected with the drive input terminal or functions as a wiring electrically connected with the detection output terminal.

Figure 9A:
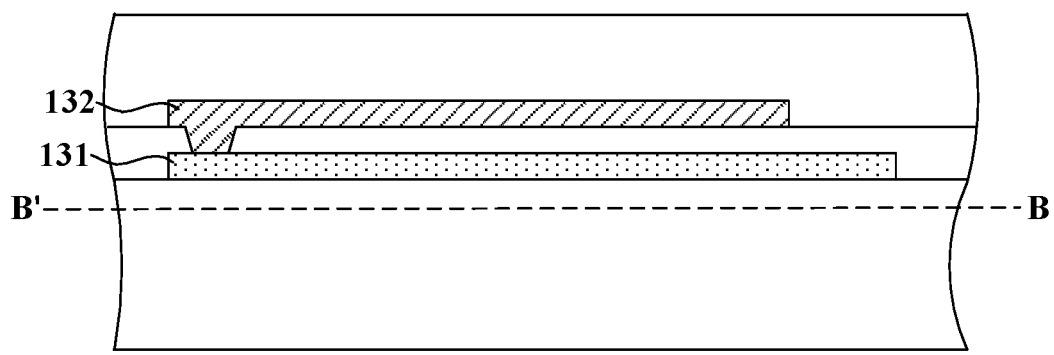
FIG. 9A-FIG. 9B are schematic diagrams of two flexible organic light-emitting display panels according to the embodiments of the disclosure.
Figure 9B:
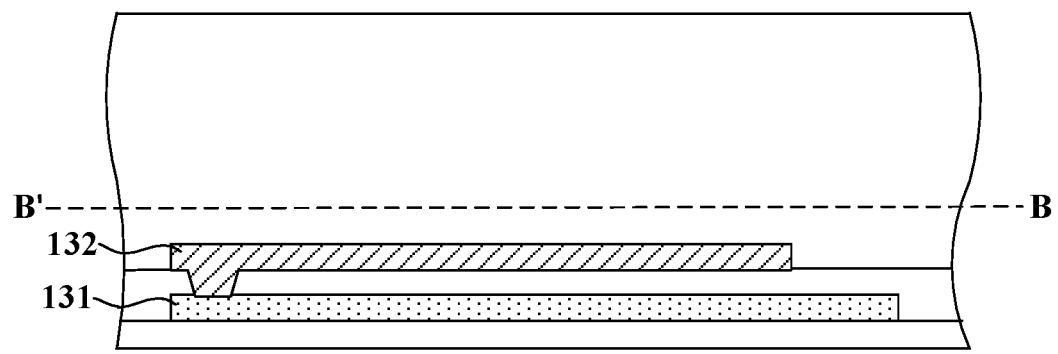

Optionally, in an embodiment of the disclosure, the flexible organic light-emitting display panel has a strain neutral surface. Referring to FIG. 9A, the first metal film wiring pattern 131 and the second metal film wiring pattern 132 are insulated from and provided on the film layer including the strain neutral surface B-B'. Alternatively, referring to FIG. 9B, the first metal film wiring pattern 131 and the second metal film wiring pattern 132 are insulated from and provided under the film layer including the strain neutral surface B-B'. The strain neutral surface B-B' is a plane which is not compressed or stretched in the case that the flexible organic light-emitting display panel is in a bent state. The strain neutral surface B-B' of the flexible organic light-emitting display panel is not be compressed or stretched in a bent state, and other film layers and planes except for the strain neutral surface B-B' are compressed and stretched in a bent state, and the first metal film wiring pattern 131 and the second metal film wiring pattern 132 are stacked with and insulated from the film layer of the strain neutral surface B-B', so that the first metal film wiring pattern 131 and the second metal film wiring pattern 132 will be compressed and stretched in a bent state. That is, any variable resistor in the metal bridge pressure-sensitive detection unit 130 will be deformed in a bent state. Any variable resistor in the metal bridge pressure-sensitive detection unit 130 will be deformed in a bent state, thus the resistance value of thereof will be changed, and hence the bent state and the bending degree of the flexible organic light-emitting display panel may be detected according to the change of the resistance value of the variable resistor in the metal bridge pressure-sensitive detection unit 130.

Figure 10A:
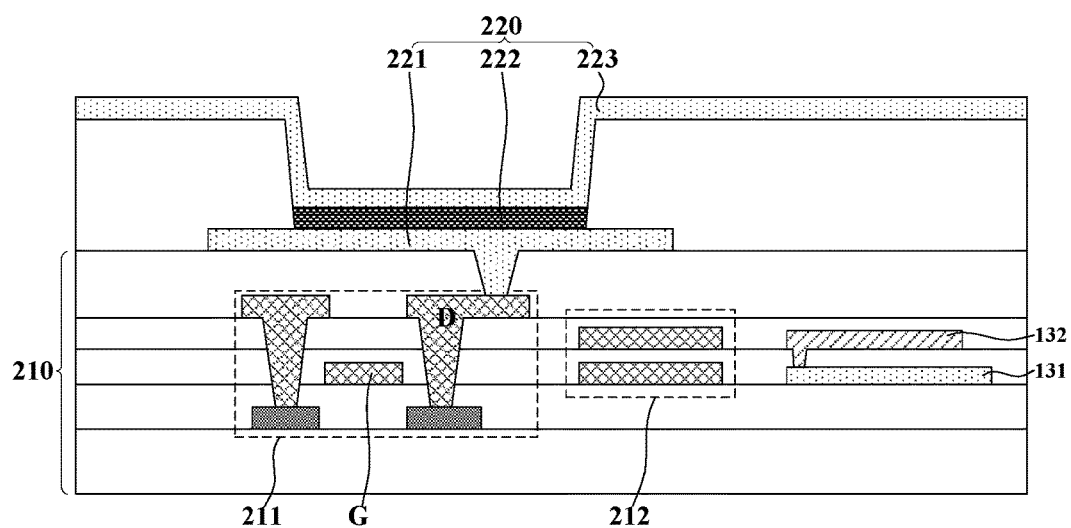
FIG. 10A-FIG. 10C are schematic diagrams of various flexible organic light-emitting display panels according to the embodiments of the disclosure.

In a particular embodiment, referring to FIG. 10A, the flexible organic light-emitting display panel according to an embodiment of the disclosure further includes: an array substrate 210, wherein the array substrate 210 includes a plurality of thin-film transistors 211 and a plurality of pixel storage capacitors 212. The array substrate 210 is provided with a plurality of organic light-emitting structures 220, the plurality of thin-film transistors 211 are provided corresponding to the plurality of organic light-emitting structures 220, and the plurality of pixel storage capacitors 212 are provided corresponding to the plurality of organic light-emitting structures 220. The organic light-emitting structure 220 successively includes a first electrode 221, a light-emitting functional layer 222 and a second electrode 223 along the direction departing from the array substrate 210, the thin-film transistor 211 includes a gate electrode G and a drain electrode D, the first electrode 221 of the organic light-emitting structure 220 is electrically connected with a corresponding drain electrode D of the thin-film transistor 211.

Optionally, the first metal film wiring pattern 131 is provided on the same layer as the gate electrode G of the thin-film transistor 211. Optionally, the second metal film wiring pattern 132 is provided on the same layer as the second pole of the pixel storage capacitor 212. The materials of the first metal film wiring pattern 131 and the gate electrode G are the same, and the gate electrode G of the thin-film transistor 211 and the first metal film wiring pattern 131 are formed simultaneously in one mask process. The materials of the second metal film wiring pattern 132 and the second pole of the pixel storage capacitor 212 are the same, and the second pole of the pixel storage capacitor 212 and the second metal film wiring pattern 132 are formed in one mask process. Therefore, the metal bridge pressure-sensitive detection unit 130 can be formed without adding the process or the cost.

Figure 10B:
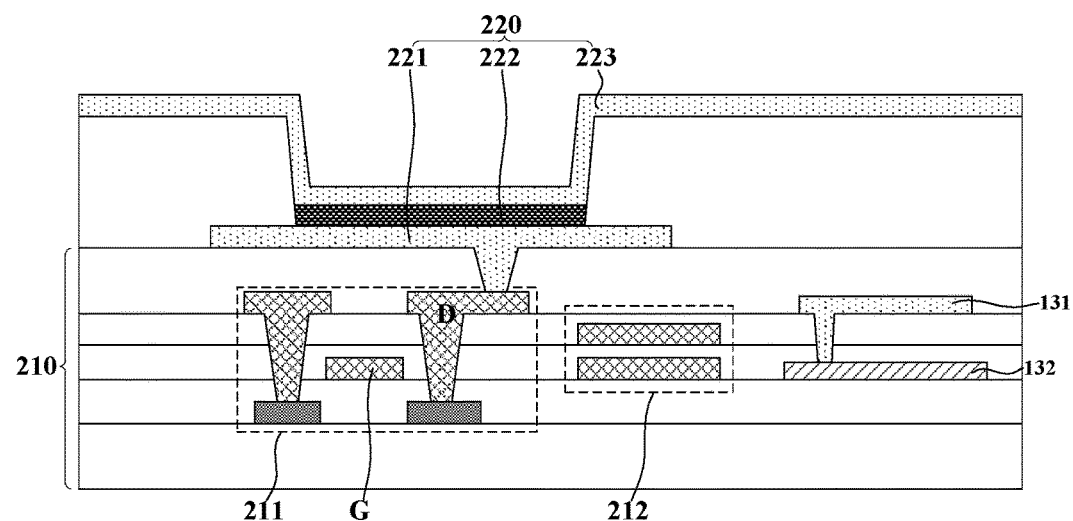

In a particular embodiment, referring to FIG. 10B, the difference from FIG. 10A lies in that, the first metal film wiring pattern 131 is provided on the same layer as the drain electrode D of the thin-film transistor 211. Optionally, the second metal film wiring pattern 132 is provided on the same layer as the first pole of the pixel storage capacitor 212. The materials of the first metal film wiring pattern 131 and the drain electrode D are the same, and the drain electrode D of the thin-film transistor 211 and the first metal film wiring pattern 131 are formed simultaneously in one mask process. The materials of the second metal film wiring pattern 132 and the first pole of the pixel storage capacitor 212 are the same, and the first pole of the pixel storage capacitor 212 and the second metal film wiring pattern 132 are formed simultaneously in one mask process. Therefore, the metal bridge pressure-sensitive detection unit 130 can be formed without adding the process or the cost.

Figure 10C:
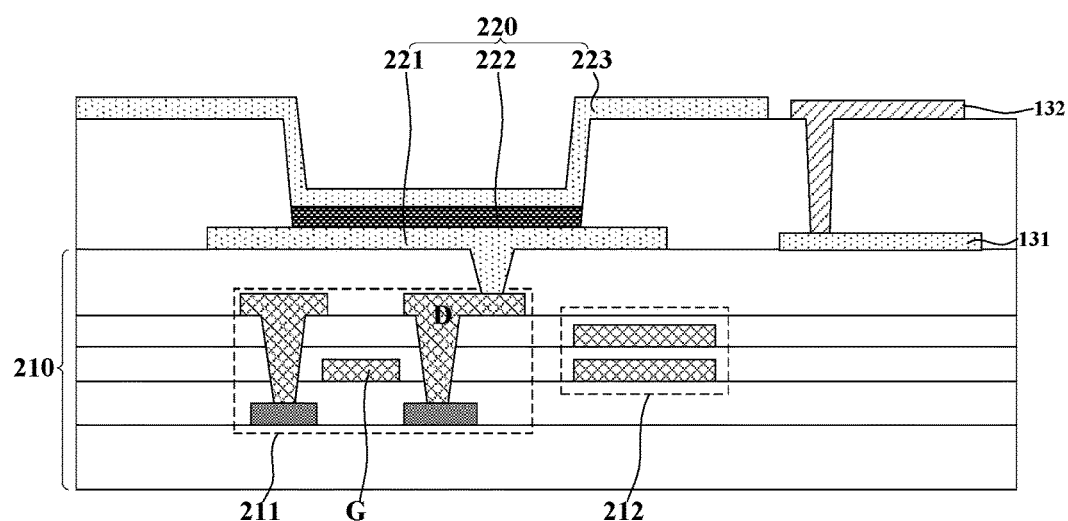

In a particular embodiment, referring to FIG. 10C, the difference from FIG. 10A-FIG. 10B lies in that, the first metal film wiring pattern 131 is provided on the same layer as the first electrode 221 of the organic light-emitting structure 220. Optionally, the second metal film wiring pattern 132 is provided on the same layer as the second electrode 223 of the organic light-emitting structure 220.

The materials of the first metal film wiring pattern 131 and the first electrode 221 of the organic light-emitting structure 220 are the same, and the first electrode 221 of the organic light-emitting structure 220 and the first metal film wiring pattern 131 are formed simultaneously in one mask process. The materials of the second metal film wiring pattern 132 and the second electrode 223 of the organic light-emitting structure 220 are the same, and the second electrode 223 of the organic light-emitting structure 220 and the second metal film wiring pattern 132 are formed simultaneously in one mask process. Therefore, the metal bridge pressure-sensitive detection unit 130 can be formed without adding the process or the cost.

Optionally, the first metal film wiring pattern is provided on the same layer as the second electrode of the organic light-emitting structure. Optionally, the second metal film wiring pattern is provided on the same layer as the first electrode of the organic light-emitting structure. In one embodiment, the film layer structure is the same as that shown in FIG. 10C, except that the first metal film wiring pattern is located on the second metal film wiring pattern.

Optionally, the first metal film wiring pattern is provided on the same layer as the first pole of the pixel storage capacitor. Optionally, the second metal film wiring pattern is provided on the same layer as the drain electrode of the thin-film transistor. In one embodiment, the film layer structure is the same as that shown in FIG. 10B, except that because the first pole of the pixel storage capacitor is provided on the same layer as gate electrode and the drain electrode is located on the gate electrode, the second metal film wiring pattern will be located on the first metal film wiring pattern.

Optionally, the first metal film wiring pattern is provided on the same layer as the second pole of the pixel storage capacitor; optionally, the second metal film wiring pattern is provided on the same layer as the gate electrode of the thin-film transistor. In one embodiment, the film layer structure is the same as that shown in FIG. 10A, except that because the second pole of the pixel storage capacitor is located on the gate electrode, the first metal film wiring pattern will be located on the second metal film wiring pattern.

It needs to be noted that, in the embodiments of the disclosure, the film layer structures of the first metal film wiring pattern and the second metal film wiring pattern include, but are not limited to, those shown in FIG. 10A-FIG. 10C, and the above film layer structures of the first metal film wiring pattern and the second metal film wiring pattern may also be combined to form various different flexible organic light-emitting display panels.

It needs to be noted that, in order to prevent from affecting the display effect of the display region and occupying the boundary of the display region, in the embodiments of the disclosure, optionally, the first metal film wiring pattern and the second metal film wiring pattern may be insulated from and provided in the non-display region of the array substrate.

It needs to be noted that, the above FIG. 1A-FIG. 10C only show a part of the structure of the flexible organic light-emitting display panel, rather than the whole structure thereof. For other structures of the flexible organic light-emitting display panel, reference may be made to the existing flexible organic light-emitting display panels, and no repeated description will be given again here. It may be understood by one skilled in the art that, in the flexible organic light-emitting display panel, the relative location, number, extension direction, film layer structure and the like of the semiconductor pressure-sensitive detection unit and the metal bridge pressure-sensitive detection unit include, but are not limited to, the examples shown above, and the above various structures may be combined or recombined without affecting the display function of the flexible organic light-emitting display panel, which will not be again described in detail here. It may also be understood by one skilled in the art that, the flexible organic light-emitting display panel according to the embodiments of the disclosure includes, but is not limited to, the examples described above; for example, the semiconductor pressure-sensitive detection unit and/or the metal bridge pressure-sensitive detection unit may also be provided in the display region of the flexible organic light-emitting display panel without affecting the display effect.

Figure 11:
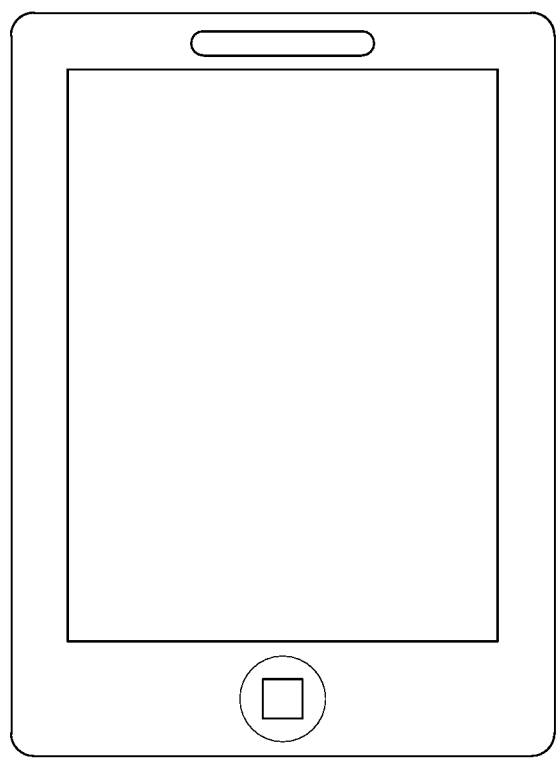
FIG. 11 is a schematic diagram of an electronic device according to an embodiment of the disclosure.

An embodiment of the disclosure further provides an electronic device, which includes any of the flexible organic light-emitting display panels described above. The electronic device may be any flexible organic light-emitting display device equipped with a flexible organic light-emitting display panel, for example, an intelligent watch, an intelligent mobile phone and a tablet computer, etc., which is not specifically limited in the disclosure. The electronic device further includes: a rigid supporting structure, which is provided in the non-bendable region of the flexible organic light-emitting display panel. Referring to FIG. 11, optionally, the electronic device is an intelligent mobile phone.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. A flexible organic light-emitting display panel, comprising:
    a display region and a non-display region surrounding the display region, wherein the non-display region comprises a bendable region and a non-bendable region;
    at least one metal bridge pressure-sensitive detection unit, which is at least partially provided in the bendable region and extends along a bending direction of the flexible organic light-emitting display panel, the at least one metal bridge pressure-sensitive detection unit comprises a first resistor, a second resistor, a third resistor and a fourth resistor; and
    a plurality of semiconductor pressure-sensitive detection units, at least one of which is provided in the non-bendable region;
    wherein a first end of the first resistor is electrically connected to a first end of the third resistor, a second end of the first resistor is electrically connected to a first end of the fourth resistor, a first end of the second resistor is electrically connected to a second end of the third resistor, and a second end of the second resistor is electrically connected to a second end of the fourth resistor;
    wherein each of the first, second, third and fourth resistors of the at least one metal bridge pressure-sensitive detection unit takes a form of a serpentine metal film wiring, a wire resistance of the first resistor is equal to a wire resistance of the second resistor, and a wire resistance of the third resistor is equal to a wire resistance of the fourth resistor, the wire resistance of the first resistor is less than the wire resistance of the third resistor; and wherein the first resistor and the second resistor both extend along the bending direction of the flexible organic light-emitting display panel, at least a part of the second resistor is arranged in the bendable region.

2. The flexible organic light-emitting display panel as claimed in claim 1, wherein at least one of the semiconductor pressure-sensitive detection units is provided in the bendable region.

3. The flexible organic light-emitting display panel as claimed in claim 1, wherein the display region has a first side and a second side opposite to each other, and the direction in which the first side of the display region points to the second side is vertical to the bending direction of the flexible organic light-emitting display panel;

the non-display region comprises a plurality of bendable regions and a plurality of non-bendable regions, wherein the plurality of bendable regions are arranged alternately with the plurality of non-bendable regions;

at least one of the plurality of semiconductor pressure-sensitive detection units is provided in the non-display region on the first side of the display region, and at least one of the plurality of semiconductor pressure-sensitive detection units is provided in the non-display region on the second side of the display region; and the at least one metal bridge pressure-sensitive detection units extends and passes through the plurality of bendable regions and the plurality of non-bendable regions.

4. The flexible organic light-emitting display panel as claimed in claim 1, wherein the first end of the first resistor and the first end of the third resistor function as a detection output positive pole, the second end of the second resistor and the second end of the fourth resistor function as a detection output negative pole, the first end of the second resistor and the second end of the third resistor function as a drive input positive pole, and the second end of the first resistor and the first end of the fourth resistor function as a drive input negative pole.

5. The flexible organic light-emitting display panel as claimed in claim 1, wherein each of a wiring length of the first resistor and a wiring length of the second resistor is larger than each of a wiring length of the third resistor and a wiring length of the fourth resistor.

6. The flexible organic light-emitting display panel as claimed in claim 1, wherein the third resistor and the fourth resistor both extend along a bending axis direction of the flexible organic light-emitting display panel, and at least a part of each of the first resistor and the second resistor is arranged in the bendable region, the each of third resistor and the fourth resistor is arranged in the bendable region, wherein, the bending direction and the bending axis direction intersect vertically with each other.

7. The flexible organic light-emitting display panel as claimed in claim 1, wherein the third resistor and the fourth resistor extend along the bending direction of the flexible organic light-emitting display panel, and at least a prat of the second resistor is arranged in the bendable region, and each of the third resistor and the fourth resistor is arranged in the non-bendable region.

8. The flexible organic light-emitting display panel as claimed in claim 1, wherein the wire resistance of the first resistor, the wire resistance of the third resistor and the wire resistance of the fourth resistor are equal to each other, and the wire resistance of the first resistor and the wire resistance of the second resistor are not equal to each other.

9. The flexible organic light-emitting display panel as claimed in claim 8, wherein the wire resistance of the first resistor is larger than the wire resistance of the second resistor.

10. The flexible organic light-emitting display panel as claimed in claim 9, wherein each of the wiring length of the first resistor, the wiring length of the third resistor and the wiring length of the fourth resistor is less than the wiring length of the second resistor.

11. The flexible organic light-emitting display panel as claimed in claim 10, wherein the third resistor and the fourth resistor both extend along a bending axis direction of the flexible organic light-emitting display panel, and each of the first resistor, the third resistor and the fourth resistor is arranged in the non-bendable region, wherein, the bending direction and the bending axis direction intersect vertically with each other.

12. The flexible organic light-emitting display panel as claimed in claim 1, wherein a metal film material employed by the resistor with a small wire resistance comprises aluminum, and a metal film material employed by the resistor with a large wire resistance comprises molybdenum or constantan.

13. The flexible organic light-emitting display panel as claimed in claim 1, wherein wiring widths of the first resistor, the second resistor, the third resistor and the fourth resistor are all 1 μm-100 μm, wherein, the wiring width of the resistor with a small wire resistance is larger than the wiring width of the resistor with a large wire resistance.

14. The flexible organic light-emitting display panel as claimed in claim 1, wherein each of the first, second, third and fourth resistors in the metal bridge pressure-sensitive detection unit comprises a first metal film wiring pattern and a second metal film wiring pattern that are stacked and insulated from each other, and the first metal film wiring pattern and the second metal film wiring pattern are electrically connected with each other by a via hole.

15. The flexible organic light-emitting display panel as claimed in claim 14, wherein the flexible organic light-emitting display panel has a strain neutral surface, and the first metal film wiring pattern and the second metal film wiring pattern are insulated from and provided on a side of a film layer of the strain neutral surface, wherein, the strain neutral surface is a plane which is not compressed or stretched in the case that the flexible organic light-emitting display panel is in a bent state.

16. The flexible organic light-emitting display panel as claimed in claim 14, further comprising: an array substrate, the array substrate comprises a plurality of thin-film transistors and a plurality of pixel storage capacitors, and the array substrate is provided with a plurality of organic light-emitting structures, the plurality of thin-film transistors are provided corresponding to the plurality of organic light-emitting structures, and the plurality of pixel storage capacitors are provided corresponding to the plurality of organic light-emitting structures, wherein, the organic light-emitting structure successively comprises a first electrode, a light-emitting functional layer and a second electrode along a direction departing from the array substrate, the thin-film transistor comprises a gate electrode and a drain electrode, and the first electrode of the organic light-emitting structure is electrically connected to the drain electrode of the corresponding thin-film transistor.

17. The flexible organic light-emitting display panel as claimed in claim 16, wherein
the first metal film wiring pattern is provided on the same layer as at least one of the gate electrode of the thin-film transistor, the drain electrode of the thin-film transistor, the first electrode of the organic light-emitting structure, the second electrode of the organic light-emitting structure, a first pole of the pixel storage capacitor and a second pole of the pixel storage capacitor;
the second metal film wiring pattern is provided on the same layer as at least one of the second pole of the pixel storage capacitor, the first pole of the pixel storage capacitor, the second electrode of the organic light-emitting structure, the first electrode of the organic light-emitting structure, the drain electrode of the thin-film transistor and the gate electrode of the thin-film transistor; and
the first metal film wiring pattern and the second metal film wiring pattern are insulatedly provided in the non-display region of the array substrate.

18. An electronic device, comprising a flexible organic light-emitting display panel, wherein the flexible organic light-emitting display panel comprises:
a display region and a non-display region surrounding the display region, wherein the non-display region comprises a bendable region and a non-bendable region;
at least one metal bridge pressure-sensitive detection unit, which is at least partially provided in the bendable region and extends along a bending direction of the flexible organic light-emitting display panel, the at least one metal bridge pressure-sensitive detection unit comprises a first resistor, a second resistor, a third resistor and a fourth resistor; and
a plurality of semiconductor pressure-sensitive detection units, at least one of which is provided in the non-bendable region;
wherein a first end of the first resistor is electrically connected to a first end of the third resistor, a second end of the first resistor is electrically connected to a first end of the fourth resistor, a first end of the second resistor is electrically connected to a second end of the third resistor, and a second end of the second resistor is electrically connected to a second end of the fourth resistor;
wherein each of the first, second, third and fourth resistors of the at least one metal bridge pressure-sensitive detection unit takes a form of a serpentine metal film wiring, a wire resistance of the first resistor is equal to a wire resistance of the second resistor, and a wire resistance of the third resistor is equal to a wire resistance of the fourth resistor, the wire resistance of the first resistor is less than the wire resistance of the third resistor; and
wherein the first resistor and the second resistor both extend along the bending direction of the flexible organic light-emitting display panel, at least a part of the second resistor is arranged in the bendable region.

19. The electronic device as claimed in claim 18, further comprising: a rigid support structure, which is provided in the non-bendable region of the flexible organic light-emitting display panel.

* * * * *